(12) United States Patent
Shibata et al.

(10) Patent No.: US 6,597,023 B2
(45) Date of Patent: Jul. 22, 2003

(54) SEMICONDUCTOR LIGHT-DETECTING ELEMENT

(75) Inventors: Tomohiko Shibata, Kasugai (JP); Keiichiro Asai, Nagoya (JP); Shigeaki Sumiya, Hekinan (JP); Mitsuhiro Tanaka, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 10/147,046

(22) Filed: May 17, 2002

(65) Prior Publication Data

US 2002/0175389 A1 Nov. 28, 2002

(30) Foreign Application Priority Data

May 24, 2001 (JP) .......................... 2001-155134
Sep. 4, 2001 (JP) .......................... 2001-266930

(51) Int. Cl.$^7$ ............... H01L 31/304; H01L 31/07; H01L 31/072; H01L 31/075
(52) U.S. Cl. ............ 257/184; 257/76; 257/190; 257/201; 257/449; 257/458
(58) Field of Search ............ 257/76, 184, 190, 257/201, 449, 458

(56) References Cited

U.S. PATENT DOCUMENTS

| 5,741,724 | A | | 4/1998 | Ramdani et al. |
|---|---|---|---|---|
| 6,046,464 | A | | 4/2000 | Schetzina |
| 6,064,078 | A | * | 5/2000 | Northrup et al. ........... 257/190 |
| 6,104,074 | A | * | 8/2000 | Chen .......................... 257/449 |
| 6,156,581 | A | | 12/2000 | Vaudo et al. |
| 2002/0020850 | A1 | | 2/2002 | Shibata et al. |

OTHER PUBLICATIONS

Kung et al., "MOCVD Growth of High Quality GaN–AlGaN Based Structures on Al$_2$O$_3$ Substrates with Dislocation Density less than 10$^7$ cm$^{-2}$", Journal of the European Ceramic Society, vol. 17, No. 15–16, pp. 1781–1785, 1997.

Pernot et al., "Solar–Blind UV Photodetectors Based on GaN/AlGaN p–i–n Photodiodes", Jpn. J. Appl. Phys., vol. 39, No. 5A, pp. L387–L389, 2000.

* cited by examiner

Primary Examiner—Gene M. Munson
(74) Attorney, Agent, or Firm—Oliff & Berridge PLC

(57) ABSTRACT

A semiconductor light-detecting element includes a given substrate, an underlayer and a light-detecting element structure which are formed on said substrate in turn. The underlayer is made of a nitride semiconductor including Al element with a dislocation density of 10$^{11}$/cm$^2$ or below. The light-detecting element structure is made of a nitride semiconductor layer group including Al element at a larger content than the nitride semiconductor making the underlayer with a dislocation density of 10$^{10}$/cm$^2$ or below.

13 Claims, 2 Drawing Sheets

SEMICONDUCTOR LIGHT-DETECTING ELEMENT

BACKGROUND OF THE INVENTION

1. Field of the Invention

This invention relates to a semiconductor light-detecting element, preferably usable as a photodiode or the like.

2. Related Art Statement

Recently, a semiconductor light-detecting element such as a photo-diode is built as a photodetector in daily necessities such as a television set, a video deck, a stereo set or an air conditioner as well as an automatic controller, an optical measuring instrument and an optical communication system. As such a semiconductor light-detecting element, a Ga-based nitride semiconductor is employed because the semiconductor material has a large direct band-gap and the band-gap can be controlled freely by adjusting the composition.

FIG. 1 is a structural view showing a conventional so-called PIN-type semiconductor light-detecting element.

In a semiconductor light-detecting element 10 shown in FIG. 1, on a substrate 1 made of a given single crystal such as sapphire, ZnO, SiC, Si, GaAs or GaN are formed a buffer layer 6 made of AlN, an underlayer 2 made of i-GaN, an n-type conductive layer 3 made of n-AlGaN, a light-detecting layer 4 made of i-AlGaN and a p-type conductive layer 5 made of p-GaN. The n-type conductive layer 3 is partially removed and exposed, and an n-type electrode 7 is formed of Al/Ti on the exposed surface of the n-type conductive layer 3, and a p-type electrode 8 is formed of Au/Ni on the p-type conductive layer 5.

When a light with a wavelength of a cut-off wavelength or below to be detected is introduced into the semiconductor light-detecting element 10, the light-detecting layer 5 is excited by the introduced light, and thus, a given current is flown in a given electric circuit including the semiconductor light-detecting element 10 via the n-type electrode 7 and the p-type electrode 8. Then, the introduced light is detected by measuring the current flown in the electric circuit.

In the semiconductor light-detectine element 10 shown in FIG. 1, the buffer layer 6 has the function to compensate the difference in lattice constant between the substrate 1 and the underlayer 2 and thus, realize the epitaxial growth of the light-detecting layer 4. In this point of view, the buffer layer 6 is made in amorphous at a lower temperature within 500–700° C., with disregard to the crystal quality.

Therefore, a relatively large amount of dislocation is created in the buffer layer 6, and then, partially propagated as threading dislocations in the underlayer 2, the n-type conductive layer 3, the light-detecting layer 4 and the p-type conductive layer 5. As a result, a large amount of dislocation results in being created in these layers at a dislocation density of $10^{10}/cm^2$ or over, and thus, the crystal qualities of these layers are deteriorated. This trend becomes conspicuous particularly if the semiconductor light-detecting element 10, that is, the n-type conductive layer 3 and the light-detecting layer 4 includes relatively large amounts of Al.

If the semiconductor light-detecting element 10 is made of such layers with large dislocation densities and thus low crystal qualities, a relatively large dark current is flown through the dislocations created in each layer. Therefore, when the introduced light is detected by measuring the current flown in the electric circuit, the measurement error is increased due to the dark current, and the S/N ratio or the detecting sensitivity of the introduced light is remarkably deteriorated.

SUMMARY OF THE INVENTION

It is an object of the present invention to provide a semiconductor light-detecting element which can reduce a dark current and thus, realize a higher detecting sensitivity.

For achieving the above object, this invention relates to a semi-conductor light-detecting element comprising a given substrate, an underlayer and a light-detecting element structure which are formed on the substrate in turn, the underlayer being made of a nitride semiconductor including Al element with a dislocation density of $10^{11}/cm^2$ or below, the light-detecting element structure being made of a nitride semiconductor layer group including Al element at a larger content than the nitride semi-conductor making the underlayer with a dislocation density of $10^{10}/cm^2$ or below.

The inventors had intensely studied to achieve the above object. Then, since the above-mentioned dark current is originated from many dislocations in the lower crystal quality layers constructing the semiconductor light-detecting element, they made an attempt to reduce the dislocations in the layers and improve the crystal qualities of the layers.

As mentioned above, the dislocations in the layers constructing the semiconductor light-detecting element are originated from the buffer layer with a lower crystal quality. Moreover, as the Al content of the n-type conductive layer 3 is increased, a large amount of dislocation is created in the conductive layer 3 because many dislocations are created at the boundary surface between the underlayer 2 and the conductive layer 3, and some cracks may be created in the conductive layer 3. This phenomenon is originated from a tensile stress in the conductive layer 3 due to smaller in-plane lattice constant in Al-richer III-nitride material.

In this point of view, the inventors made various attempts for the underlayer as well as the buffer layer. As is apparent from FIG. 1, the conventional semiconductor light-detecting element is constructed of the conductive layers and light-detecting layer made of Ga-based nitride semiconductor. So, it is natural that the underlayer is also made of Ga-based nitride semiconductor, for example, GaN. As a result, a mismatch in lattice constant for the substrate made of such as sapphire single crystal is created, and thus, a buffer layer made at a lower temperature is required to mitigate the mismatch.

However, the inventors paid an attention to the composition of the underlayer and made an attempt to vary the composition. Consequently, they found out that the underlayer is made of Al-based nitride semiconductor which has a lower dislocation density and thus, higher crystal quality. The underlayer can be epitaxially grown directly on the substrate made of e.g., sapphire single crystal without the buffer layer by compensating the difference in lattice constant. In addition, the crystal qualities and thus, the dislocation densities of the conductive layers and the light-detecting layer which are epitaxially grown on the underlayer can be improved.

As a result, the dislocation densities of the respective semiconductor layers constructing the semiconductor light-detecting layer are reduced and thus, the dark current can be effectively repressed. Therefore, the error of the measured current value flown in the electric circuit due to the dark current can be reduced, and thus, the detecting sensitivity of the semiconductor light-detecting element can be improved.

BRIEF DESCRIPTION OF THE DRAWINGS

For better understanding of the present invention, reference is made to the attached drawings, wherein.

DESCRIPTION OF THE PREFERRED EMBODIMENTS

Figure 1:
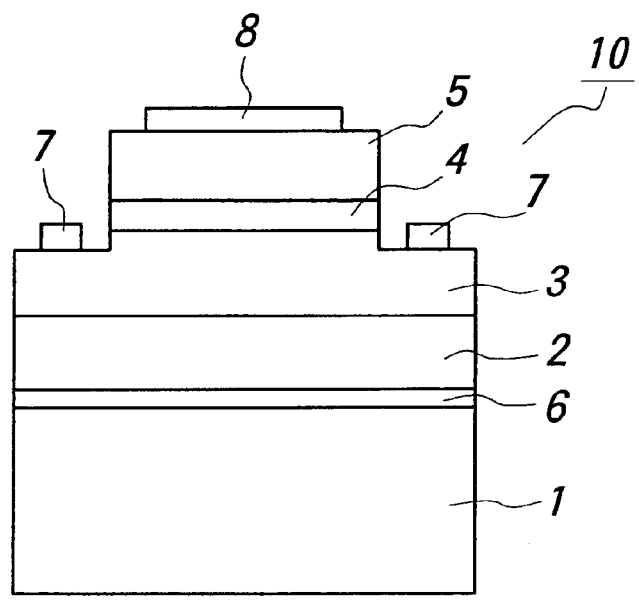
FIG. 1 is a structural view showing a conventional semiconductor light-detecting element.

This invention will be described in detail with reference to the accompanying drawings. FIG. 2 is a structural view showing a semiconductor light-detecting element according to the present invention. A semiconductor light-detecting element 20 shown in FIG. 2 includes, on a substrate 11, an underlayer 12, an n-type conductive layer 13, a light-detecting layer 14, and a p-type conductive layer 15. As the semiconductor light-detecting element 10 shown in FIG. 1, a p-type electrode 18 made of Au/Ni is provided on the p-type conductive layer 15 and an n-type conductive layer 17 made of Al/Ti is provided on the exposed surface of the n-type conductive layer 13. As a result, the semiconductor light-detecting element 20 is fabricated as a PIN-type semiconductor light-detecting element.

In FIG. 2, the n-type conductive layer 13, the light-detecting layer 14 and the p-type conductive layer 15 are classified in a nitride semiconductor layer group, and the semiconductor light-detecting element 20 is composed of the nitride semiconductor layer group, the n-type electrode 17 and the p-type electrode 18.

The underlayer 12 is required to be made of nitride semiconductor including at least Al element with a dislocation density of $10^{11}/cm^2$ or below, preferably $10^{10}/cm^2$. In this case, the underlayer 12 can be epitaxially grown directly on the substrate 11, compensating the difference in lattice constant for the substrate 11, and then, the n-type conductive layer 13, the light-detecting layer 14 and the p-type conductive layer 15 can be epitaxially grown on the underlayer 13 in good condition.

The Al contents of the n-type conductive layer 13, the light-detecting layer 14 and the p-type conductive layer 15 are required to be set lower than the Al content of the underlayer 12. In addition, the dislocation densities of the n-type conductive layer 13, the light-detecting layer 14 and the p-type conductive layer 15 are required to be set to $10^{10}/cm^2$ or below. In this case, a dark current in the semiconductor light-detecting element 20 can be effectively reduced.

The reason is that threading dislocations due to the difference in Al content between the underlayer 12 and the n-type conductive layer 13 are reduced, and then, the dislocation densities and thus the crystal qualities of the n-type conductive layer 13, the light-detecting layer 14 and the p-type conductive layer 15 are improved.

The above-mentioned phenomenon becomes conspicuous as the Al content of the underlayer 12 is increased. Therefore, it is desired that the Al content of the underlayer 12 is set to 50 atomic percentages or over for all of the III elements, and particularly the underlayer 12 is made of AlN (Al content of 100 atomic percentages).

If the underlayer 12 is made of such a higher Al-including semi-conductor nitride, the crystal quality of the n-type conductive layer 13 can be more enhanced, and then, the crystal qualities and thus, the reduction in dislocation density of the n-type conductive layer 13, the light-detecting layer 14 and the p-type conductive layer 15 can be developed.

For example, if the underlayer 12 is made of AlN and the n-type conductive layer 13, formed directly on the underlayer 12, is made of AlGaN with a relatively large amount of Ga, the dislocation density of the n-type conductive layer 13 can be more reduced due to the large difference in composition between the underlayer 12 and the n-type conductive layer 13. As of now, the dislocation density of the n-type conductive layer 13 can be reduced to $10^9/cm^2$ or below, particularly $10^8/cm^2$ or below.

As a result, the dislocation densities of the light-detecting layer 14 and the p-type conductive layer 15 which are formed on the n-type conductive layer 13 are easily and inevitably reduced to $10^9/cm^2$ or below. As of now, the dislocation densities can be reduced to $10^8/cm^2$ or below.

The underlayer 12 with lower dislocation density and thus higher crystal quality which is made of Al-including nitride semiconductor may be made by a MOCVD method. In this case, the temperature of the substrate 11 is appropriately controlled, and preferably set to 1100° C. or over, particularly 1250° C. or below.

In view of the crystallinity of the underlayer 12, it is desired that the thickness of the underlayer 12 is large, but too large thickness may cause the creation of crack in the underlayer 12 and the exfoliation of the underlayer 12. Therefore, the thickness of the underlayer 12 is set to 0.5 μm or over, particularly within 1–3 μm.

Only if the n-type conductive layer 13 and the like are epitaxially grown on the underlayer 12 with the lower dislocation density and the higher crystal quality by utilizing a MOCVD method, the reduction in dislocation density and the higher crystal qualities of the layers constructing the semi-conductor light-detecting element 20 can be improved.

The substrate 11 may be made of oxide single crystal such as sapphire single crystal, ZnO single crystal, $LiAlO_2$ single crystal, $LiGaO_2$ single crystal, $MgAl_2O_4$ single crystal, or MgO single crystal, IV single crystal or IV—IV single crystal such as Si single crystal or SiC single crystal, III–V single crystal such as GaAs single crystal, AlN single crystal, GaN single crystal or AlGaN single crystal, and boride single crystal such as $ZrB_2$.

In the case of employing the sapphire single crystal as the substrate 11, it is desired that a main surface of the substrate 11 on which the underlayer 12 is formed is heated and treated under a nitrogen atmosphere including $NH_3$ or the like. In this case, a surface nitrided layer is created at the surface region of the substrate 11. The thickness of the surface nitrided layer is controlled by appropriately adjusting the nitrogen concentration, the nitriding temperature and the nitriding period of time.

If the underlayer 12 is formed on the substrate 11 via the surface nitrided layer, the crystal quality can be more enhanced. Moreover, the underlayer 12 can be easily formed thick, e.g., to the upper limited value of 3 μm as mentioned above without under a specific forming condition. Therefore, the crystal qualities and thus the reduction in dislocation density of the n-type conductive layer 13, the light-detecting layer 14 and the p-type conductive layer 15 which are epitaxially grown on the underlayer 12 can be improved.

In this case, even though in forming the underlayer 12, the temperature of the substrate 11 is set to 1200° C. or below, particularly around 1150° C., the crystal quality can be maintained higher condition, and thus, the dislocation density can be easily reduced to $10^{10}/cm^2$ or below.

In addition, if the underlayer 12 is formed thick on the substrate 11 via the surface nitrided layer, cracks are not almost created and the exfoliation does not almost occur. Therefore, the underlayer 12 can be easily formed thick, e.g., to about 3 μm without under a specific forming condition. Therefore, the crystal quality and the reduction in dislocation density of the underlayer 12 can be more enhanced due to the synergy effect of the large thickness and the surface nitrided surface.

The surface nitrided layer is preferably formed thin in a thickness of 1 nm or below, or formed thick so that the nitrogen content at a depth of 1 nm from the main surface of the substrate 11 is set to 2 atomic percentages or above.

In the semiconductor light-detecting element 20 shown in FIG. 2, although the n-type conductive layer 13 is located below the light-detecting layer 14 and the p-type conductive layer 15 is located above the light-detecting layer 14, the other way round will do.

Figure 3:
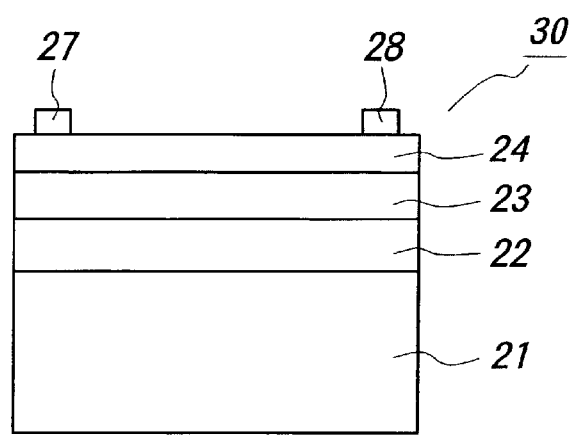
FIG. 3 is a structural view showing another semiconductor light-detecting element according to the present invention.

FIG. 3 is a structural view showing another semiconductor light-detecting element according to the present invention.

A semiconductor light-detecting element 30 shown in FIG. 3 includes an underlayer 22, a conductive layer 23 and a light-detecting layer 24 in turn. Then, on the light-detecting layer 24 are provided Schottky electrodes 27 and 28 made of oxide such as InSb oxide. Therefore, the semiconductor light-detecting element 30 is fabricated as a MIS-type semiconductor light-detecting element.

In FIG. 3, the conductive layer 23 and the light-detecting layer 24 are classified in a nitride semiconductor layer group, and the semiconductor light-detecting element 30 is composed of the nitride semiconductor layer group and the Schottky electrodes 27 and 28.

It is required that the underlayer 22 includes Al element and the dislocation density of the underlayer 22 is set to $10^{11}/cm^2$ or below, preferably $10^{10}/cm^2$ or below. The Al content of the underlayer 22 is preferably set to 50 atomic percentages or over for all of the III elements, and particularly, the underlayer 22 is made of AlN (Al content of 100 atomic percentages).

The underlayer 22 with higher crystal quality may be made on the substrate 21 heated to 1100° C. or over and preferably 1250° C. or below by a MOCVD method, as mentioned above. Also, the thickness of the underlayer 22 is set to 0.5 μm or over, particularly within 1–3 μm.

In addition, the Al contents of the conductive layer 23 and the light-detecting layer 24 are set lower than the Al content of the underlayer 22, and the dislocation densities of the conductive layer 23 and the light-detecting layer 24 are set to $10^{10}/cm^2$ or below. As mentioned above, if the difference in composition between the underlayer 22 and the conductive layer 23 is set larger, the dislocation density of the conductive layer 23 is reduced and thus, the dislocation density of the light-detecting layer 24 is also reduced, concretely to $10^9/cm^2$ or below.

In the MIS type semiconductor light-detecting element 30 shown in FIG. 3, a light with a wavelength of a cut-off wavelength or below is introduced to excite the light-detecting layer 24. Then, a given current is flown in a given electric circuit including the semiconductor light-detecting element 30 via the Schottky electrodes 27 and 28. Therefore, the introduced light can be detected by measuring the current flown in the electric circuit.

In the MIS-type semiconductor light-detecting element 30, the substrate 21 may be made of sapphire single crystal, etc., as mentioned above. Also, in the case of employing the sapphire single crystal, a main surface of the substrate 21 on which the underlayer 22 is formed is heated and treated under a nitrogen atmosphere, to form a surface nitrided layer at the surface region of the substrate 21.

Figure 4:
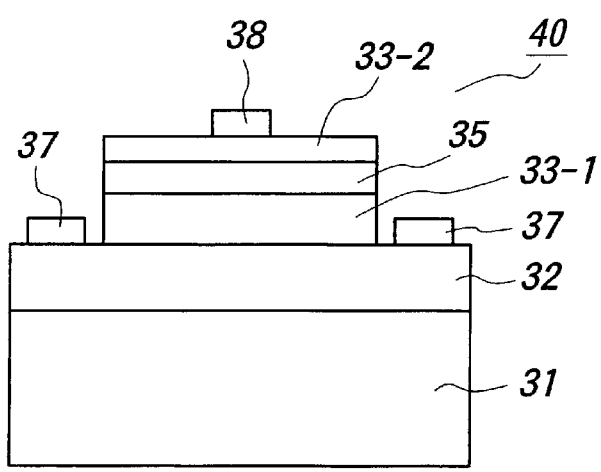
FIG. 4 is a structural view showing still another semiconductor light-detecting element according to the present invention.

FIG. 4 is a structural view showing still another semiconductor light-detecting element according to the present invention. A semiconductor light-detecting element 40 shown in FIG. 4 includes, on a substrate 31, an underlayer 32, n-type conductive layers 33-1 and 33-2, a p-type conductive layer 35 which is located between the n-type conductive layers 33-1 and 33-2. The underlayer 32 is partially exposed. Then, electrodes 37 are provided on the exposed surface of the underlayer 32, and an n-type electrode 38 is provided on the n-type conductive layer 33-2. In this case, the semiconductor light-detecting element 40 is fabricated as a heterojunction bipolar type transistor.

The n-type conductive layers 33-1 and 33-2 and the p-type conductive layer 35 are classified in a nitride semiconductor layer group, and the semi-conductor light-detecting element 40 is composed of the nitride semiconductor layer group, the electrodes 37 and the n-type electrode 38.

It is required that the underlayer 32 includes Al element and the dislocation density of the underlayer 32 is set to $10^{11}/cm^2$ or below, preferably $10^{10}/cm^2$ or below. The Al content of the underlayer 32 is preferably set to 50 atomic percentages or over for all of the III elements, and particularly, the underlayer 32 is made of AlN (Al content of 100 atomic percentages).

The underlayer 32 with higher crystal quality may be made on the substrate 31 heated to 1100° C. or over and preferably 1250° C. or below by a MOCVD method, as mentioned above. Also, the thickness of the underlayer 32 is set to 0.5 μm or over, particularly within 1–3 μm.

In addition, the Al contents of the n-type conductive layers 33-1 and 33-2 and the p-type conductive layer 35 are set lower than the Al content of the underlayer 32, and the dislocation densities of the n-type conductive layers 33-1 and 33-2 and the p-type conductive layer 35 are set to $10^{10}/cm^2$ or below. As mentioned above, if the difference in composition between the underlayer 32 and the n-type conductive layer 33-1 is set larger, the dislocation density of n-type conductive layer 33-1 is reduced and thus, the dislocation densities of the p-type conductive layer 35 and the n-type conductive layer 33-2 which are formed above the n-type conductive layer 33-1 are also reduced, concretely to $10^9/cm^2$ or below.

In the semiconductor light-detecting element 40 constructed as a heterojunction bipolar type transistor, a light with a wavelength of a cut-off wavelength or below is introduced to excite the n-type conductive layers 33-1 and 33-2 and the p-type conductive layer 35. Then, a given current is flown in a given electric circuit including the semiconductor light-detecting element 40 via the electrodes 37 and 38. Therefore, the introduced light can be detected by measuring the current flown in the electric circuit.

Although in FIG. 4, the p-type conductive layer 35 is sandwiched with the n-type conductive layers 33-1 and 33-2, the other way round will do.

In the semiconductor light-detecting element 40 constructed as a heterojunction bipolar type transistor, the substrate 31 may be made of sapphire single crystal, etc., as mentioned above. Also, in the case of employing the sapphire single crystal, a main surface of the substrate 31 on which the underlayer 32 is formed is heated and treated under a nitrogen atmosphere, to form a surface nitrided layer at the surface region of the substrate 31.

Figure 5:
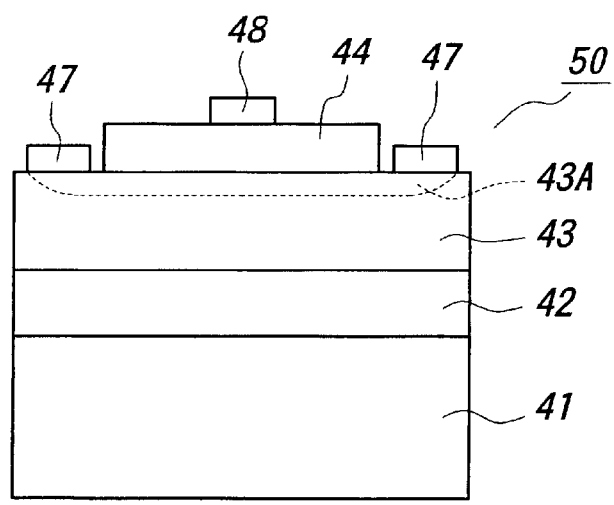
FIG. 5 is a structural view showing a further semiconductor light-detecting element according to the present invention.

FIG. 5 is a structural view showing a further semiconductor light-detecting element according to the present invention.

A semiconductor light-detecting element 50 shown in FIG. 5 includes, on a substrate 41, an underlayer 42, a conductive layer 43, a semiconductor layer 44 functioning as a carrier layer. The conductive layer 43 is partially exposed. Then, electrodes 47 are provided on the exposed surface of the conductive layer 43, and another electrode 48 is provided on the semiconductor layer 44. In this case, the semiconductor light-detecting element 50 is fabricated as a hetero-junction FET type transistor.

The conductive layer 43 and the semiconductor layer 44 are classified in a nitride semiconductor layer group, and the semiconductor light-detecting element 50 is composed of the nitride semiconductor layer group, and the electrodes 47 and 48.

It is required that the underlayer 42 includes Al element and the dislocation density of the underlayer 42 is set to $10^{11}/cm^2$ or below, preferably $10^{10}/cm^2$ or below. The Al content of the underlayer 42 is preferably set to 50 atomic percentages or over for all of the III elements, and particularly, the underlayer 42 is made of AlN (Al content of 100 atomic percentages).

The underlayer 42 with higher crystal quality may be made on the substrate 31 heated to 1100° C. or over and preferably 1250° C. or below by a MOCVD method, as mentioned above. Also, the thickness of the underlayer 42 is set to 0.5 µm or over, particularly within 1–3 µm.

In addition, the Al contents of the conductive layer 43 and the semi-conductor layer 44 are set lower than the Al content of the underlayer 42, and the dislocation density of the conductive layer 43 and the semiconductor layer 44 are set to $10^{10}/cm^2$ or below. As mentioned above, if the difference in composition between the underlayer 42 and the conductive layer 43 is set larger, the dislocation density of the conductive layer 43 is reduced and thus, the dislocation density of the semiconductor layer 44 which is formed above the conductive layer 43 is also reduced, concretely to $10^9/cm^2$ or below.

In the semiconductor light-detecting element 50 constructed as a heterojunction FET type transistor, a light with a wavelength of a cut-off wavelength or below is introduced to excite the semiconductor layer 44, to inject carriers into the conductive layer 43 from the semiconductor layer 44. The carriers are flown through a carrier movable surface layer 43A which is formed near the boundary surface between the conductive layer 43 and the semiconductor layer 44, and then, flown in a given electric circuit including the semiconductor light-detecting element 50 via the electrodes 47 and 48. Therefore, the introduced light can be detected by measuring the current flown in the electric circuit.

In the semiconductor light-detecting element 50 constructed as a heterojunction FET type transistor, the substrate 41 may be made of sapphire single crystal, etc., as mentioned above. Also, in the case of employing the sapphire single crystal, the main surface of the substrate 41 on which the underlayer 42 is formed is heated and treated under a nitrogen atmosphere, to form a surface nitrided layer at the surface region of the substrate 41.

In the semiconductor light-detecting element shown in FIGS. 2–5, the Al content of the underlayer is preferably decreased continuously or stepwisely toward the conductive layer from the substrate, if the substrate is made of sapphire single crystal, and the underlayer is made of AlN and the conductive layer is made of AlGaN with a large amount of Ga.

In this case, the Al content of the region of the underlayer in the vicinity of the substrate is large and the Al content of the region of the underlayer in the vicinity of the conductive layer is small, so that the differences in lattice constant between the underlayer and the substrate and between the underlayer and the conductive layer can be reduced. Therefore, even though the underlayer is formed thick, the creation of crack in the underlayer can be repressed, compensating the tensile stress in the underlayer.

Since the semiconductor light-detecting element is made of semi-conductor layers with high crystal quality, the warping degree can be reduced to 100 µm or below per 5 cm length. Therefore, the remaining stress can be removed sufficiently from the semiconductor light-detecting element, and the destruction and the performance fluctuation due to the remaining stress can be repressed.

EXAMPLES

Example

In this example, a PIN type semiconductor light-detecting element as shown in FIG. 2 was fabricated.

A sapphire single crystal substrate having a diameter of 2 inches and a thickness of 430 µm was employed as the substrate 11, and set into a MOCVD apparatus. To the MOCVD apparatus was attached a gas system of $H_2$, $N_2$, TMA, TMG, $Cp_2Mg$, $NH_3$, and $SiH_4$. The pressure in the MOCVD apparatus was set to a pressure of 15 Torr, and the substrate was heated to 1150° C. with flowing $H_2$ gas at an average flow rate of 3 m/sec.

Then, a $NH_3$ gas was flown with a $H_2$ carrier gas for five minutes, to nitride the main surface of the substrate 11. It was turned out that a given nitrided layer was formed at the main surface of the substrate 11 by the nitriding treatment by means of ESCA analysis, and the nitrogen content at a depth of 1 nm from the main surface of the substrate was 7 atomic percentages.

Then, a TMA and an $NH_3$ gas were introduced and supplied onto the substrate 11 at a ratio of TMA:$NH_3$=450:1, to form an AlN layer as the under-layer 12 in a thickness of 1 µm on the substrate 11. In this case, the film-forming rate was set to 1 µm/hr by controlling the flow rates of the TMA and the $NH_3$. It was turned out that the dislocation density of the AlN layer was $8 \times 10^9/cm^2$ by means of TEM observation.

Then, the temperature of the substrate 11 was set to 1120° C., and a TMA, a TMG, an $NH_3$ gas and a $SiH_4$ gas were introduced at a total flow rate of 3 m/sec, to form a Si-doped n-$Al_{0.4}Ga_{0.6}N$ layer as the n-type conductive layer 13 in a thickness of 2 µm. In this case, the flow ratio was set to $NH_3$:TMA:TMG=600:2:8, and the total amount supplied of the TMA, the TMG and the $NH_3$ was set so that the film-forming rate was set to 1.5 µm/hr. Also, the $SiH_4$ was supplied so that the carrier concentration of the n-$Al_{0.4}Ga_{0.6}N$ layer was set to $3 \times 10^{17} Cm^3$.

Then, the $SiH_4$ was stopped in supply, to form an i-$Al_{0.4}Ga_{0.6}N$ layer as the light-detecting layer 14 in a thickness of 0.005 µm on the n-$Al_{0.4}Ga_{0.6}N$ layer. Then, the TMA was stopped in supply and a $Cp_2Mg$ was supplied at a carrier concentration of $3 \times 10^{17}/cm^3$, to form a Mg-doped p-GaN layer as the p-type conductive layer 15 in a thickness of 0.5 μm.

It was turned out that the dislocation densities of the n-$Al_{0.4}Ga_{0.6}N$ layer, the i-$Al_{0.4}Ga_{0.6}N$ layer and the p-GaN layer were $5 \times 10^8/cm^2$, $5 \times 10^8/cm^2$ and $3 \times 10^8/cm^2$, respectively by means of TEM observation.

Then, the thus obtained multilayered structure was partially etched and removed, to expose a portion of the n-$Al_{0.4}Ga_{0.6}N$ layer as the n-type conductive layer 13, and an Al/Ti electrode as the n-type electrode 17 was fabricated on the exposed portion of the n-$Al_{0.4}Ga_{0.6}N$ layer. Then, an Au/Ni electrode as the p-type electrode 18 was fabricated on the p-GaN layer as the p-type conductive layer 15.

The dark current of the thus obtained semiconductor light-detecting element 20 was 10 $pA/mm^2$.

Comparative Example

Figure 2:
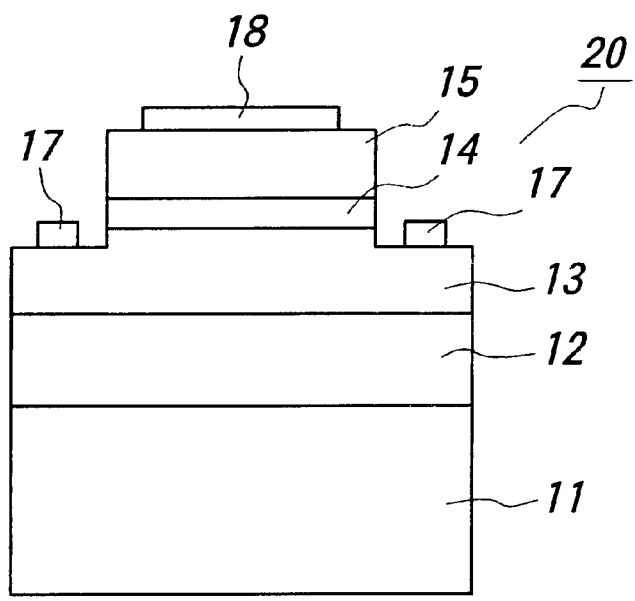
FIG. 2 is a structural view showing a semiconductor light-detecting element according to the present invention.

In this comparative example, a-PIN type semiconductor light-detecting element as shown in FIG. 1 was fabricated. First of all, a sapphire single crystal substrate as the substrate 1 was pre-treated and set in a MOCVD apparatus in the same manner as in Example.

The pressure in the MOCVD apparatus was set to a pressure of 100 Torr, and the substrate 1 was heated to 1100° C. for ten minutes so that the main surface of the substrate 1 was cleaned with flowing a $H_2$ gas at an average flow rate of 1.5 m/sec. Then, the substrate 1 was cooled down to 600° C., and a TMG and an $NH_3$ gas were supplied at a flow ratio of TMG:$NH_3$=1500:1, to form a GaN layer as the buffer layer 6 in a thickness of 0.03 μm.

Thereafter, the TMG and the $NH_3$ gas were stopped in supply, and the substrate 1 was heated to 1050° C. Then, the TMG and the $NH_3$ gas were supplied in the same condition as in forming the GaN layer as the buffer layer 6, to form an i-GaN layer as the underlayer 2 in a thickness of 3 μm at a film-forming rate of 2 μm/hr. It was turned out that the dislocation density of the i-GaN layer was $2 \times 10^{10}/cm^2$ by means of TEM observation.

Then, an n-$Al_{0.4}Ga_{0.6}N$ layer with a thickness of 0.5 μm, an i-$Al_{0.4}Ga_{0.6}N$ layer with a thickness of 0.005 μm and a p-GaN layer with a thickness of 0.5 μm were formed as the n-type conductive layer 3, the light-detecting layer 4 and the p-type conductive layer 5, respectively in the same conditions as in Example, and an Al/Ti electrode and an Au/Ni electrode were formed as the n-type electrode 7 and the p-type electrode 8, to fabricate a semiconductor light-detecting element 10.

It was turned out that the dislocation densities of the n-$Al_{0.4}Ga_{0.6}N$ layer, the i-$Al_{0.4}Ga_{0.6}N$ layer and the p-GaN layer were $8 \times 10^{10}/cm^2$, $8 \times 10^{10}/cm^2$ and $3 \times 10^{10}/cm^2$, respectively by means of TEM observation.

The dark current of the semiconductor light-detecting element 10 was 30 $pA/mm^2$.

As is apparent from Example and Comparative Example, in the semiconductor light-detecting element 20 fabricated according to the present invention, the crystal quality and thus the dislocation density of each semi-conductor layer composing the element 20 is improved, so that the dark current of the element 20 is reduced. Therefore, if the semiconductor light-detecting element is employed for a light-detecting instrument or the like, it can exhibit a higher sensitivity, compared with the conventional semiconductor light-detecting element 10.

Although the present invention was described in detail with reference to the above examples, this invention is not limited to the above disclosure and every kind of variation and modification may be made without departing from the scope of the present invention. For example, a given buffer layer or a multilayered structure such as a distorted superlattice structure may be intervened between the under layer and the conductive layer for more improving the crystal qualities of the conductive layer and the light-detecting layer. In this case, the temperature of the substrate, the flow rates of raw material gases, the pressure in an apparatus, supplied amounts of raw material gases and the sort of an additive gas are appropriately selected and controlled.

In addition, an additive element such as Ge, Si, Mg, Zn, Be, P, or B may be included in the underlayer. Also, a minute impurity contained in the raw material gases and the reactor or contained dependent on the forming condition may be included in the underlayer, as well as the additive element which is intentionally contained.

The present invention can be applied for various semiconductor light-detecting element as well as the PIN-type or the MIS type semiconductor light-detecting element.

As mentioned above, the semiconductor light-detecting element of the present invention includes the underlayer which is made of a high crystal quality nitride semiconductor with low dislocation density including Al element, so that the conductive layer and the light-detecting layer can be epitaxially grown, compensating the difference in lattice constant between the substrate and the underlayer without a conventional buffer layer. Moreover, the crystal qualities can be improved and thus the dislocation densities of the conductive layer and the light-detecting layer can be reduced due to the high crystal quality of the underlayer.

As a result, since the semiconductor light-detecting element is composed of high crystal quality nitride semiconductor layers, the dark current can be repressed, to enhance the light-detecting sensitivity.

What is claimed is:

1. A semiconductor light-detecting element comprising a given substrate, an underlayer and a light-detecting element structure which are formed on said substrate in turn, said underlayer being made of a nitride semiconductor including Al element with a dislocation density of $10^{11}/cm^2$ or below, said light-detecting element structure being made of a nitride semiconductor layer group including Al element at a larger content than said nitride semiconductor making said underlayer with a dislocation density of $10^{10}/cm^2$ or below.

2. A semiconductor light-detecting element as defined in claim 1, wherein the Al content of said nitride semiconductor making said underlayer is set to 50 atomic percentages or over.

3. A semiconductor light-detecting element as defined in claim 2, wherein said nitride semiconductor making said underlayer is AlN.

4. A semiconductor light-detecting element as defined in claim 1, wherein said underlayer is formed of said nitride semiconductor at 1100° C. or over by means of a MOCVD method.

5. A semiconductor light-detecting element as defined in claim 4, wherein said underlayer is formed of said nitride semiconductor at a temperature within 1100–1250° C. by means of said MOCVD method.

6. A semiconductor light-detecting element as defined in claim 1, wherein said substrate is made of sapphire single crystal, and said underlayer is formed on a nitrided main surface of said substrate.

7. A semiconductor light-detecting element as defined in claim 1, wherein said nitride semiconductor layer group making said light-detecting element structure includes a conductive layer and a light-detecting layer which are formed on said substrate in turn.

8. A semiconductor light-detecting element as defined in claim 7, wherein the Al content of said nitride semiconductor making said underlayer is varied continuously or stepwisely toward said light-detecting element structure from said substrate.

9. A semiconductor light-detecting element as defined in claim 1, wherein said nitride semiconductor layer group making said light-detecting element structure includes an n-type conductive layer, a p-type conductive layer and a light-detecting layer which is located between said n-type conductive layer and said p-type conductive layer.

10. A semiconductor light-detecting element as defined in claim 1, wherein said nitride semiconductor layer group making said light-detecting element structure includes plural n-type conductive layers and a p-type conductive layer which is located between said n-type conductive layers.

11. A semiconductor light-detecting element as defined in claim 1, wherein said nitride semiconductor layer group making said light-detecting element structure includes plural p-type conductive layers and an n-type conductive layer which is located between said p-type conductive layers.

12. A semiconductor light-detecting element as defined in claim 1, wherein said nitride semiconductor layer group making said light-detecting element structure includes a conductive layer and a semiconductor layer which are formed on said substrate in turn, and a carrier movable surface layer is formed in a portion of said conductive layer in the vicinity of a boundary surface between said conductive layer and said semiconductor layer.

13. A semiconductor light-detecting element as defined in claim 1, wherein the warping degree is 100 $\mu$m or below per 5 cm length.

* * * * *